United States Patent
Dong et al.

(10) Patent No.: US 7,387,972 B2
(45) Date of Patent: Jun. 17, 2008

(54) REDUCING NITROGEN CONCENTRATION WITH IN-SITU STEAM GENERATION

(75) Inventors: Zhong Dong, San Jose, CA (US); Chiliang Chen, Sunnyvale, CA (US); Ching-Hwa Chen, Milpitas, CA (US)

(73) Assignee: Promos Technologies Pte. Ltd., Singapore (SG)

( * ) Notice: Subject to any disclaimer, the term of this patent is extended or adjusted under 35 U.S.C. 154(b) by 0 days.

(21) Appl. No.: 11/365,013

(22) Filed: Mar. 1, 2006

(65) Prior Publication Data

US 2007/0207627 A1  Sep. 6, 2007

(51) Int. Cl.
*H01L 21/31* (2006.01)
*H01L 21/469* (2006.01)

(52) U.S. Cl. .............. 438/769; 438/770; 438/791; 438/786

(58) Field of Classification Search ........... 438/769, 438/770, 786, 791
See application file for complete search history.

(56) References Cited

U.S. PATENT DOCUMENTS

| | | | |
|---|---|---|---|
| 6,143,608 A | 11/2000 | He et al. | |
| 6,555,524 B2 | 3/2002 | Tuan | |
| 6,784,515 B1 | 8/2004 | Li | |
| 6,803,272 B1 * | 10/2004 | Halliyal et al. | 438/240 |
| 7,037,863 B2 * | 5/2006 | Doh et al. | 438/785 |
| 7,115,469 B1 * | 10/2006 | Halliyal et al. | 438/257 |
| 7,115,943 B2 * | 10/2006 | Mine et al. | 257/324 |
| 7,118,968 B2 * | 10/2006 | Hsieh | 438/261 |
| 2001/0003381 A1 | 6/2001 | Orlowski et al. | |
| 2002/0146914 A1 * | 10/2002 | Huang et al. | 438/769 |
| 2002/0197784 A1 * | 12/2002 | Luoh et al. | 438/211 |
| 2003/0017670 A1 * | 1/2003 | Luoh et al | 438/257 |
| 2003/0059993 A1 * | 3/2003 | Fukasaku | 438/197 |
| 2003/0153149 A1 | 8/2003 | Dong | |
| 2003/0155582 A1 | 8/2003 | Mahajani et el. | |
| 2005/0009371 A1 | 1/2005 | Metzner et al. | |
| 2005/0199940 A1 * | 9/2005 | Mine et al. | 257/315 |
| 2005/0221564 A1 * | 10/2005 | Bevan et al. | 438/287 |
| 2005/0227437 A1 * | 10/2005 | Dong et al. | 438/265 |
| 2006/0017092 A1 * | 1/2006 | Dong et al. | 257/314 |
| 2006/0110865 A1 * | 5/2006 | Liu et al. | 438/151 |
| 2006/0192248 A1 * | 8/2006 | Wang | 257/324 |

OTHER PUBLICATIONS

Kee, Robert J.; Yang, Wenhua; Sullivan, Neal; Dean, Anthony M.; Zojaji, Ali; Hall, Michael; Williams, Meredith, "The Formation of Ultra-Thin Silicon-Oxide Films Using $H_2$-$N_2O$ Mixtures" Engineering Division and Chemical Engineering Department, Applied Materials, Inc, p. 2-18.

* cited by examiner

*Primary Examiner*—George Fourson
*Assistant Examiner*—John M Parker
(74) *Attorney, Agent, or Firm*—Michael Shenker; MacPherson Kwok Chen & Heid LLP

(57) ABSTRACT

In-situ steam generation (ISSG) is used to reduce the nitrogen concentration in silicon and silicon oxide areas.

24 Claims, 5 Drawing Sheets

US 7,387,972 B2

REDUCING NITROGEN CONCENTRATION WITH IN-SITU STEAM GENERATION

BACKGROUND OF THE INVENTION

The present invention relates to fabrication of integrated circuits, and more particularly to use of in-situ steam generation (ISSG) to form silicon oxide on regions containing silicon and/or silicon oxide and also containing nitrogen.

Nitrogen has been introduced into MOS transistors' gate dielectrics formed of silicon dioxide because nitrogen impedes boron and phosphorus diffusing between the transistor's gate and the channel and source/drain regions. See e.g. U.S. patent application published as No. 2001/0003381 on Jun. 14, 2001, filed by Orlowski et al., incorporated herein by reference. The nitrogen presence is not always desirable, however, because nitrogen can cause degradation of the transistor's performance (due to an increased oxide charge for example). U.S. Pat. No. 6,143,608, issued Nov. 7, 2000 to He et al. describes flash memory fabrication processes in which the gate oxide for the memory cell transistors is formed before the gate oxide for the peripheral transistors. The gate oxide for the memory cell transistors is nitrided, and the nitrogen contaminates the silicon substrate in the peripheral areas. When the peripheral areas are later oxidized to form the gate oxide for the peripheral transistors, the nitrogen slows down the oxidation process and also makes the peripheral gate oxide thickness unpredictable. In addition, the nitrogen undesirably reduces the peripheral transistors' breakdown voltages. The U.S. Pat. No. 6,143,608 therefore proposes to mask the peripheral areas with silicon nitride during the nitridation of the gate oxide of the memory cell transistors. Another solution is to etch away the nitrogen-contaminated silicon region in the periphery before growing the gate oxide for the peripheral transistors.

SUMMARY

This section summarizes some features of the invention. Other features are described in the subsequent sections. The invention is defined by the appended claims which are incorporated into this section by reference.

The inventor has discovered that when silicon oxide is grown on a silicon region containing nitrogen by in-situ steam generation (ISSG), the nitrogen concentration can be reduced and predictable silicon oxide thickness can be provided. Moreover, the silicon oxide thickness is not highly dependent on the initial nitrogen concentration. Therefore, in some embodiments, ISSG makes it unnecessary to mask the peripheral areas or to etch away the silicon portion contaminated with nitrogen.

The inventor has also discovered that similar benefits are obtained when ISSG is used to increase the thickness of a silicon oxide layer contaminated with nitrogen.

It is believed that the nitrogen removal can be enhanced by adding diluent gasses (e.g. argon) in the ISSG process.

The invention is not limited to the features and advantages described above. Other features are described below. The invention is defined by the appended claims.

DESCRIPTION OF SOME EMBODIMENTS

The embodiments described in this section illustrate but do not limit the invention. The invention is defined by the appended claims.

Figure 1:
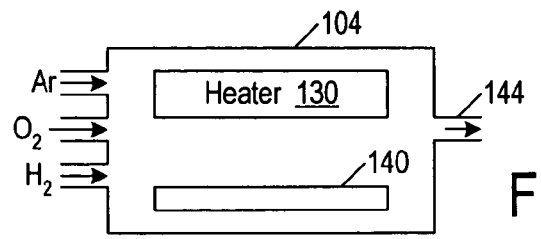
FIG. 1 is a block diagram of an ISSG processing chamber suitable for some embodiments of the present invention.

FIG. 1 illustrates a conventional ISSG chamber 104, such as described in U.S. patent application published as No. 2002/0146914 A1 on Oct. 10, 2002, filed by Huang et al., incorporated herein by reference. A silicon wafer 110 is placed in the chamber heated by a heater 130. Hydrogen, oxygen, and possibly other gases (e.g. argon or helium) are flown into the chamber. Hydrogen reacts with oxygen to form water vapor, i.e. $H_2O$. The water vapor oxidizes silicon to form silicon dioxide ($SiO_2$) and hydrogen. The gaseous by-products are pumped out via an exhaust path 144.

Figure 2:
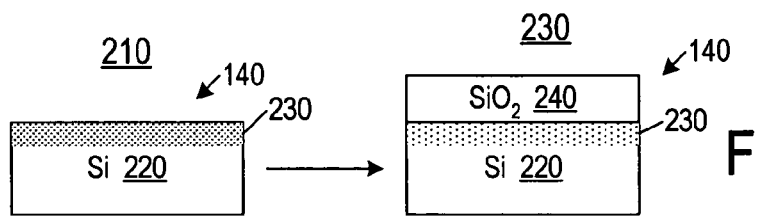
FIG. 2 illustrates forming silicon oxide on a silicon region containing nitrogen.

In FIG. 2, reference number 210 marks the silicon wafer 140 before the ISSG processing. The wafer contains a silicon substrate 220 (possibly, but not necessarily, monocrystalline silicon). The top region 230 of substrate 220 contains possibly unbound nitrogen atoms. Number 230 marks the wafer after the ISSG processing. The ISSG processing results in formation of silicon dioxide layer 240 on region 220. The nitrogen concentration in region 230 is reduced.

Figure 3:
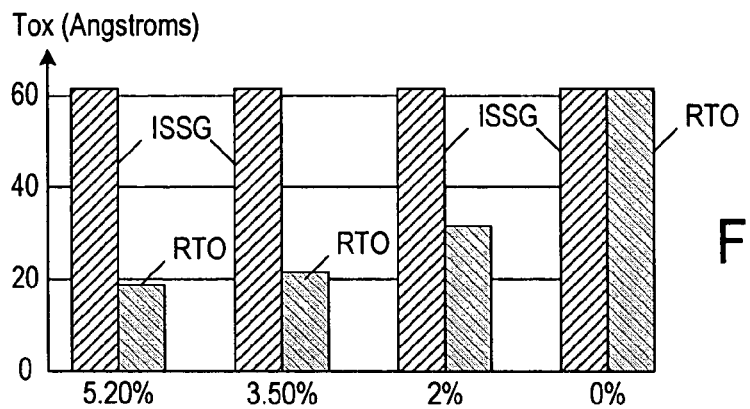
FIG. 3 is a chart illustrating the silicon oxide thickness as a function of the initial nitrogen concentration when the procedure of FIG. 2 is implemented by ISSG or Rapid Thermal Oxidation (RTO).

FIG. 3 is a bar diagram comparing the ISSG processing with RTO for thermal oxidation of wafer 140. In both cases, the initial wafer was as in FIG. 2 at 210. Nitrogen was introduced into region 230 by thermal nitridation using NO and/or $N_2O$. (Nitrogen can also be introduced by thermal nitridation with $NH_3$ or by other methods, e.g. decoupled plasma nitridation or remote plasma nitridation or ion implantation, but this was not done in the experiment being described.) The ISSG was performed at 900°~1100° C. at a pressure of 5~15 torr for 20~200 seconds. The hydrogen flow was 0.1~2.0 liters per minute, the oxygen flow was 3~10 liters per minute, the argon flow was 0~10 liters per minute. The processing was conducted in a chamber designed for 8-inch wafers. (For a 12-inch wafer, the flow rates may be 30~100% higher.) The resulting oxide 240 was about 60 Ụ thick. Four ISSG experiments were performed, with the initial nitrogen concentration in region 230 being respectively 5.20%, 3.50%, 2%, and 0% (atomic percent). The RTO was also performed on four different wafers, with the same initial nitrogen concentrations. The RTO temperature was 950°~1100° C.; the oxygen flow was 3~10 liters per minute; the pressure was 700~780 torr; the duration was 20~200 seconds. For each nitrogen concentration, the ISSG oxide thickness and the RTO oxide thickness are shown by the adjacent bars in FIG. 3. For the ISSG, the resulting thickness of oxide 240 was about 60 Ụ regardless of the initial nitrogen concentration. For the RTO, the resulting oxide thickness strongly depended on the initial nitrogen concentration, varying from about 60 ∪ at zero concentration to below 20 ∪ for the 5.20% concentration.

Figure 4:
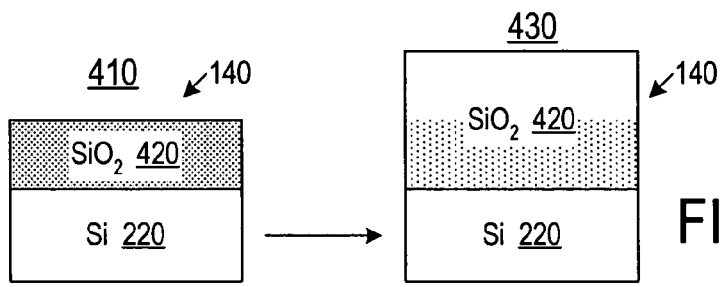
FIG. 4 illustrates forming additional silicon oxide on a silicon oxide region containing nitrogen.

FIG. 4 illustrates oxidation of an initial wafer 140 (stage 410) having a silicon dioxide region 420 formed on silicon region 220 (possibly monocrystalline silicon). Nitrogen can be introduced into oxide 420 by thermal nitridation using NO and/or $N_2O$, or by other techniques described above. In some embodiments, nitrogen was introduced by thermal nitridation, and was present both in oxide 420 and silicon 220. The nitrogen concentration reached a peak value close to the silicon/oxide interface. The wafer was processed by ISSG to increase the thickness of oxide 420, as shown at 430. The nitrogen concentration in oxide 420 was reduced by the ISSG processing.

Figure 5:
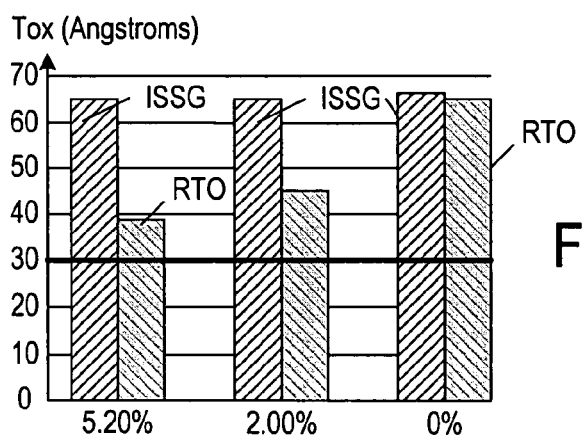
FIG. 5 is a chart illustrating the silicon oxide thickness as a function of the initial nitrogen concentration when the procedure of FIG. 4 is implemented by ISSG or Rapid Thermal Oxidation (RTO).

FIG. 5 is a bar diagram comparing the ISSG processing with RTO to oxidize the wafer at the initial stage 410. In both cases, the initial thickness of oxide 420 was 30 ∪. The ISSG was performed at 900~1100° C. at a pressure of 5~15 torr for 20~200 seconds. The hydrogen flow was 0.1~2 liters per minute, the oxygen flow was 3~10 liters per minute, the argon flow was 0~10 liters per minute. The processing was conducted in a chamber designed for 8-inch wafers. (For a 12-inch wafer, the flow rates may be 30~100% higher.) The oxide 420 thickness was increased to about 65 ∪. Three experiments were performed, with the initial nitrogen concentration in oxide 420 being respectively 5.20%, 2.00%, and 0% (atomic percent). The RTO was also performed on three different wafers, with the same initial nitrogen concentrations. The RTO temperature was 950°~1100° C.; the oxygen flow was 3~10 liters per minute; the pressure was 700~780 torr; the duration was 20~200 seconds. For each nitrogen concentration, the ISSG oxide thickness and the RTO oxide thickness at stage 430 are shown by adjacent bars in FIG. 5. For the ISSG, the final oxide thickness was about 65 ∪ regardless of the initial nitrogen concentration. For the RTO, the resulting oxide thickness strongly depended on the initial nitrogen concentration, varying from above 60 ∪ at zero concentration (30 ∪ of new oxide was grown) to below 40 ∪ (less than 10 ∪ of new oxide) for the 5.20% concentration.

Figure 6:
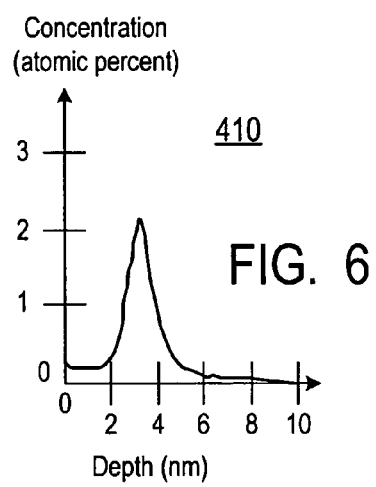
FIGS. 6-9 are graphs showing nitrogen concentration at different depths for at different stages of integrated circuit fabrication.
Figure 7:
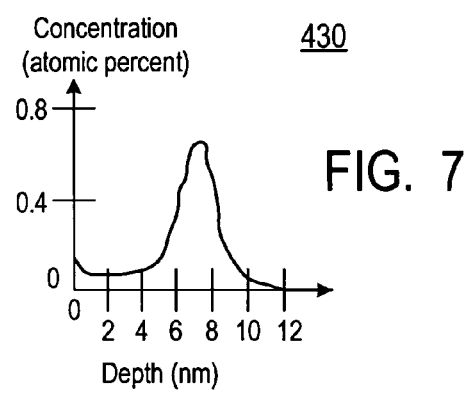

FIGS. 6 and 7 are graphs of the nitrogen concentration versus depth (the distance from the top surface of oxide 420) at stages 410 (FIGS. 4 and 6) and 430 (FIGS. 4 and 7) for another wafer processed with ISSG. The initial oxide thickness was about 30 ∪ (at 410), and the final oxide thickness was about 70 ∪ (at 430). The nitrogen was present both in oxide 420 and in silicon 220 both before and after the ISSG processing. The ISSG oxidation was performed at 900°~1100° C. at a pressure of 5~15 torr for 20~200 seconds. The nitrogen concentration reached its peak value at the depth of about 30 ∪ in FIG. 6, and at the depth of about 70 ∪ in FIG. 7, and was reduced from about 2.2 atomic percent in FIG. 6 to about 0.7 atomic percent in FIG. 7, or from $2.61 \times 10^{14}$ atoms/cm$^2$ to about $1.41 \times 10^{14}$ atoms/cm$^2$. The area under the curve in each figure is indicative of the total nitrogen content. The area was reduced from 3.73 to 1.87.

Figure 8:
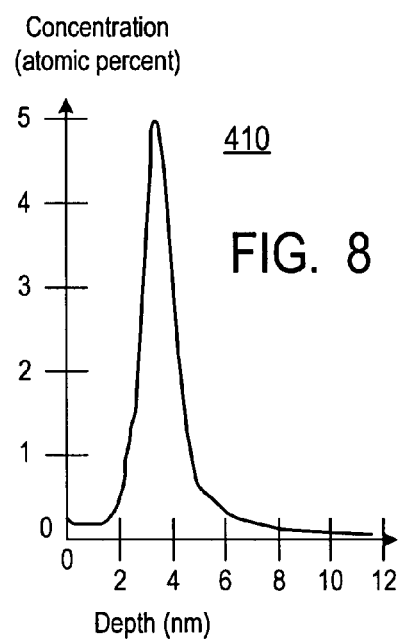
Figure 9:
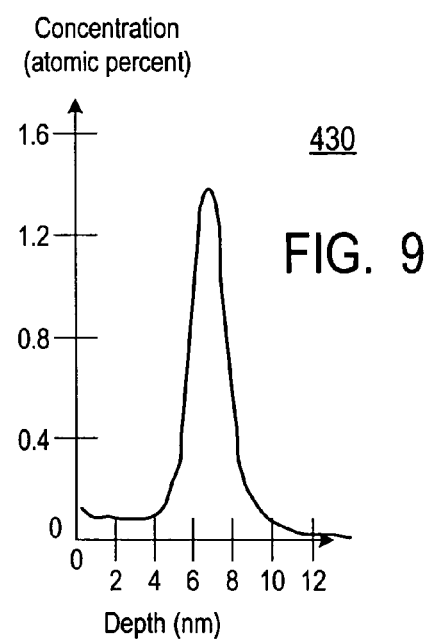

FIGS. 8 and 9 are similar graphs for another wafer with a higher nitrogen concentration. The initial oxide thickness was about 30 ∪, and the final oxide thickness was about 70 ∪. The nitrogen was present both in oxide 420 and in silicon 220 both before and after the ISSG processing. The ISSG oxidation was performed at 900°1100° C. at a pressure of 5~15 torr for 20~200 seconds. The nitrogen concentration reached its peak value at the depth of about 30 ∪ in FIG. 8, and at the depth of about 70 ∪ in FIG. 9, and was reduced from about 5 atomic percent in FIG. 8 to about 1.41 atomic percent in FIG. 9, or from $5.80 \times 10^{14}$ atoms/cm$^2$ to about $2.47 \times 10^{14}$ atoms/cm$^2$. The area under the curve was reduced from 8.41 to 3.33.

Without limiting the invention, the ISSG process is believed to involve the following mechanisms. In the absence of nitrogen, the oxidation reaction is believed to be as follows:

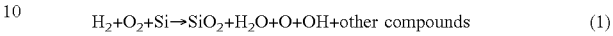

If nitrogen is present in the wafer, the atomic oxygen reacts with nitrogen to form gaseous nitric oxide (NO) and/or nitrous oxide ($N_2O$). More particularly,

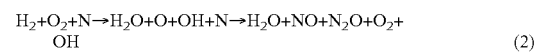

It is believed that the nitrogen removal can be enhanced if the NO and $N_2O$ gases are diluted by argon. In some embodiments, the argon flow rate is about 0~200% of the hydrogen flow rate, the hydrogen flow rate is about 1~20% of the oxygen flow rate, and the oxygen flow rate is 3~10 liters per minute. The temperature is 900°~1100° C. The pressure is 5~15 torr.

The ISSG processing is suitable for a wide range of nitrogen concentration values. In some embodiments of FIG. 2 (growing silicon oxide on bare silicon) and FIG. 4 (growing silicon oxide on silicon oxide), the initial nitrogen concentration values are 1~10% (atomic percent), and the final nitrogen concentration values are 0.3~3%, and other values are possible.

Figure 10:
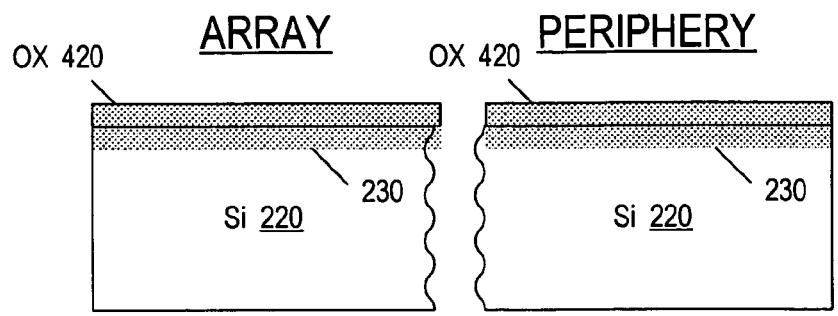
FIGS. 10-18 are vertical cross sections of integrated circuits in the process of fabrication according to some embodiments of the present invention.

The ISSG processes described above can be used for transistor fabrication. In FIG. 10, silicon dioxide 420 is formed on silicon substrate 220 in the array and peripheral areas of a non-volatile memory. Oxide 420 will provide a tunnel oxide for the memory cells. The oxide is nitrided either during or after deposition. As a result, unbound nitrogen atoms are present in oxide 420 and, possibly, the top region 230 of substrate 220. The nitridation can be performed with plasma (e.g. by remote plasma nitridation or decoupled plasma nitridation processes described in U.S. patent application Ser. No. 10/071,689 filed Feb. 8, 2002 by Z. Dong et al. and incorporated herein by reference), or by ion implantation, or by thermal nitridation (e.g. using NO, $N_2O$, and/or $NH_3$), or possibly by other processes.

Polysilicon 1110 (FIG. 11) is deposited on oxide 420. ONO 1120 (a stack of silicon dioxide, silicon nitride, silicon dioxide layers) is formed on polysilicon 1110. Then a photoresist mask (not shown) is formed on the array area, and the layers 1120, 1110, 420 are etched off the periphery. See e.g. U.S. Pat. No. 6,555,524 B1 issued Mar. 12, 2002 to Tuan et al. (incorporated herein by reference) for suitable processes.

Silicon dioxide 1210 (FIG. 12) is grown in the periphery by an ISSG process described above to provide at least a portion of the gate oxide for peripheral transistors. The nitrogen content in region 230 in the periphery is reduced. A uniform oxide layer is provided. This step may increase the thickness of the top, oxide sub-layer of ONO 1120 in the array area, or may even create the top sub-layer, i.e. the top oxide sub-layer may be absent at the stage of FIG. 11.

Figure 13:
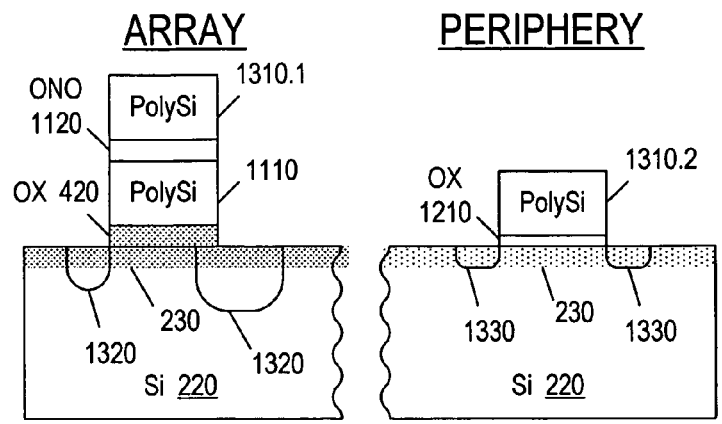

The memory fabrication may be completed using known techniques. In some embodiments, polysilicon 1310 (FIG. 13) is deposited and patterned to provide control gates 1310.1 for the memory array and peripheral transistor gates 1310.2 for the periphery. ONO 1120 and polysilicon 1110 are patterned as needed to form the floating gates from layer 1110. Dopant is implanted into substrate 220 to provide source/drain regions 1320 for the array transistors and source/drain regions 1330 for the peripheral transistors. In some embodiments, polysilicon 1110 and/or substrate 220 and/or source/drain regions 1320 are doped with boron and/or phosphorus in the array area, and the nitrogen in oxide 420 impedes the dopant diffusion across the oxide 420.

Figure 11:
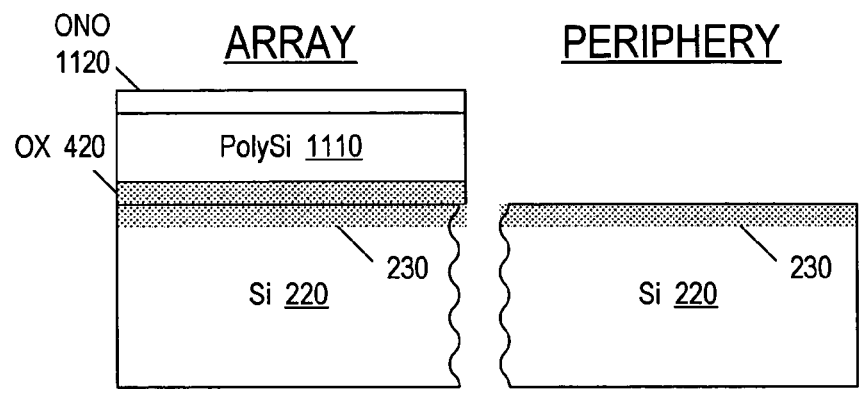

In some embodiments, nitridation can be performed at the stage of FIG. 11 to nitride the top oxide sub-layer of ONO 1120. This is done to reduce the leakage current through ONO 1120. See e.g. the aforementioned U.S. patent application Ser. No. 10/071,689. The nitridation can be performed by any of the techniques described above without a mask on the peripheral area. Unbound nitrogen atoms may be present in the peripheral portion of silicon 220 as a result. The ISSG is used as in FIG. 12 to grow oxide 1210 of a uniform thickness and reduce the nitrogen concentration in the periphery.

Figure 12:
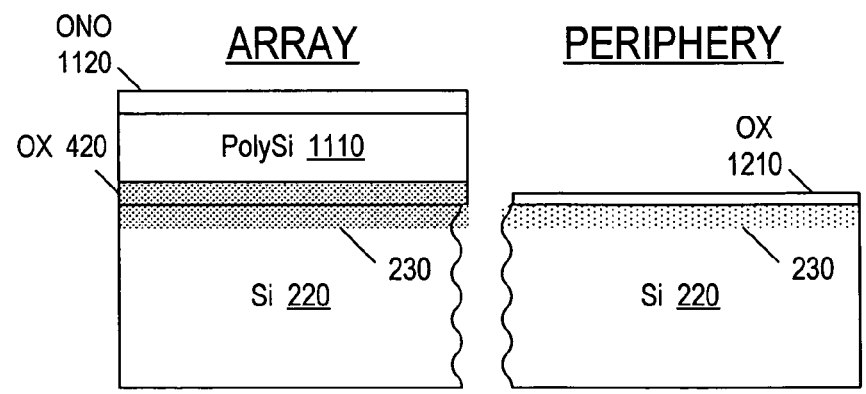
Figure 14:
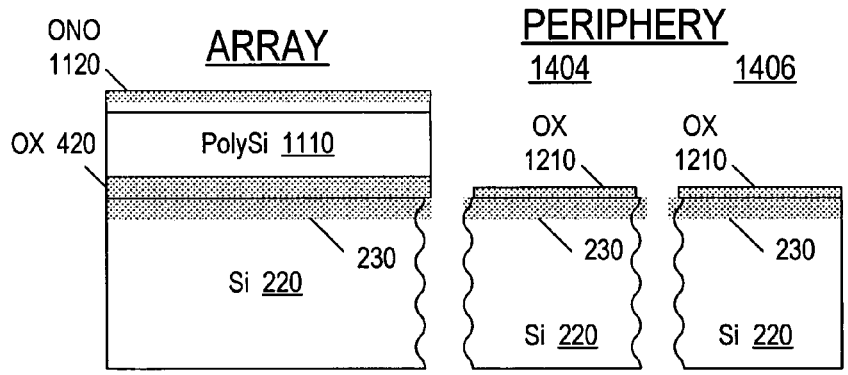
Figure 15:
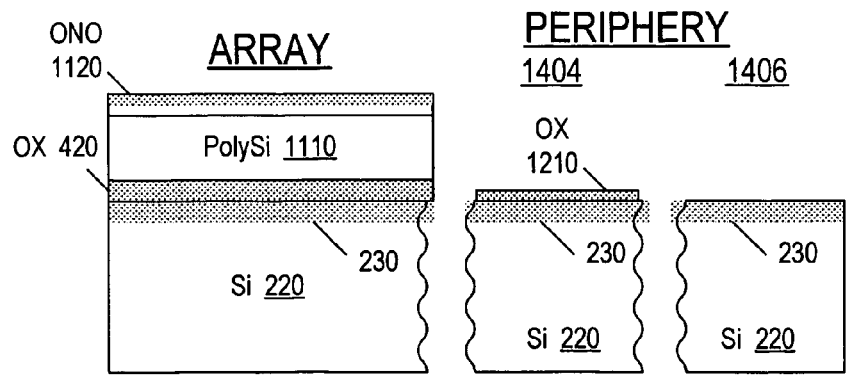
Figure 16:
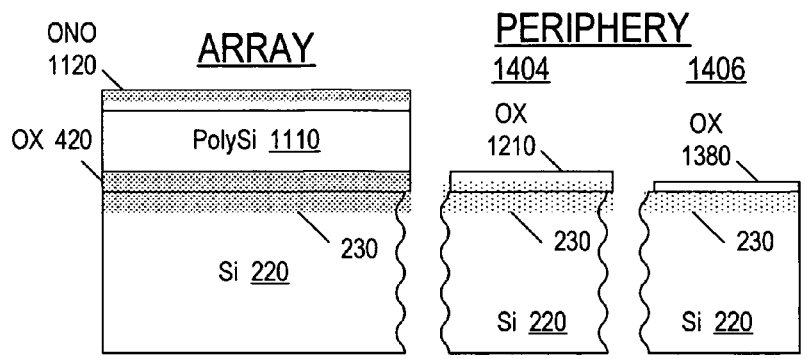

In the example of FIG. 14, the nitridation of ONO 1120 is performed without a mask at the stage of FIG. 12, so nitrogen is incorporated into oxide 1210 and the underlying region of silicon 220. The peripheral area includes areas 1404 and 1406. The transistors in the area 1404 will have a thicker gate oxide than in area 1406. The array and area 1404 are masked, and oxide 1210 is etched away in area 1406 (FIG. 15). The mask (not shown) is removed, and additional silicon oxide 1380 (FIG. 16) is grown in area 1406 by any of the ISSG processes described above. The thickness of oxide 1210 increases in area 1404 during this step. The nitrogen concentration in oxide 1210 and in region 230 in areas 1404, 1406 is reduced.

Figure 17:
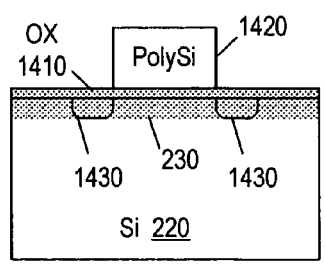
Figure 18:
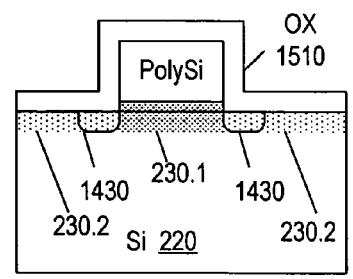

The combination of nitridation and ISSG can be incorporated into many processes, known or to be invented. In the example of FIG. 17, nitrided silicon oxide 1410 is formed on silicon substrate 220. The nitridation can be performed by any of the techniques described above. Oxide 1410 and, possibly, the top region 230 of substrate 220 contain unbound nitrogen atoms. Doped polysilicon 1420 is deposited on oxide 1420 and patterned to form a transistor gate. Dopant is implanted into the structure to form source/drain regions 1430. Then another silicon dioxide layer 1510 (FIG. 18) is grown on polysilicon gate 1420 and on areas of substrate 220 laterally adjacent to the gate by an ISSG process described above. Oxide 1410 can be etched away from the surface of substrate 220 before the fabrication of oxide 1510, or oxide 1410 can be left in place. Region 230 is shown to have a sub-region 230.1 under the gate 1420 and sub-regions 230.2 laterally adjacent to gate 1420. The ISSG process reduces nitrogen concentration in the regions 230.2 and provides a predictable, uniform oxide thickness on substrate 220.

The invention is not limited to the embodiments described above. In particular, the invention is not limited to the temperatures, pressures, flow rates, and other parameters of the ISSG and other processes. The invention is not limited to the ISSG applications of FIGS. 10-18. Other embodiments and variations are within the scope of the invention, as defined by the appended claims.

The invention claimed is:

1. A method for fabricating an integrated circuit, the method comprising:
   providing a first region containing silicon and/or silicon oxide and also containing nitrogen, the first region being part of the integrated circuit; and then
   growing silicon oxide on the first region by in-situ steam generation (ISSG) while reducing nitrogen concentration in the first region during the ISSG;
   wherein providing the first region comprises nitriding the first region and a second region of the integrated circuit;
   wherein the method further comprises, after nitriding the first region and the second region, forming a third region over the second region;
   wherein growing the silicon oxide comprises growing the silicon oxide on the first region while reducing the nitrogen concentration in the first region while the second region is protected by the third region.

2. The method of claim 1 wherein growing the silicon oxide comprises flowing hydrogen, oxygen, and one or more gases into a chamber containing the first region, wherein the one or more gases are flown at a flow rate equal to at least 2.5% of a flow rate of the hydrogen.

3. The method of claim 2 wherein the one or more gases are argon.

4. The method of claim 1 wherein providing the first region comprises providing a silicon region with a nitrogen concentration of at least 1 atomic percent and at most 10 atomic percent; and
   growing the silicon oxide comprises growing the silicon oxide on the silicon region while reducing the nitrogen concentration in the silicon region down from the at least 1 atomic percent and at most 10 atomic percent.

5. The method of claim 1 wherein providing the first region comprises providing a silicon oxide region with a nitrogen concentration of at least 1 atomic percent and at most 10 atomic percent; and
   growing the silicon oxide comprises growing the silicon oxide on the silicon oxide region while reducing the nitrogen concentration in the silicon oxide region down from the at least 1 atomic percent and at most 10 atomic percent.

6. The method of claim 1 wherein providing the first region comprises providing unbound nitrogen atoms in the first region; and
   growing the silicon oxide comprises growing the silicon oxide on the first region provided with the unbound nitrogen atoms.

7. The method of claim 1 wherein the second region is a gate dielectric region of a transistor, the gate dielectric comprising silicon oxide.

8. The method of claim 7 wherein a gate of the transistor and/or a channel region of the transistor and/or a source/drain region of the transistor comprise boron and/or phosphorus.

9. The method of claim 1 wherein growing the silicon oxide comprises flowing hydrogen and oxygen but not any nitrogen nor any nitrogen compound into a chamber containing the first region.

10. The method of claim 9 wherein growing the silicon oxide comprises flowing only the hydrogen, the oxygen, and either argon or helium into the chamber.

11. The method of claim 9 wherein growing the silicon oxide comprises the oxygen reacting with the nitrogen in the first region to form a gaseous nitrogen compound.

12. The method of claim 1 wherein growing the silicon oxide comprises flowing hydrogen and oxygen into a chamber containing the first region and causing the oxygen to react with the nitrogen in the first region to form a gaseous nitrogen compound.

13. The method of claim 2 wherein the one or more gases are flown at the flow rate equal to at least 100% of the flow rate of the hydrogen.

14. The method of claim 1 wherein the peak nitrogen concentration in the first region is reduced by at least a factor of 2 during the ISSG.

15. The method of claim 1 wherein growing the silicon oxide comprises:
   providing a chamber containing the first region ; and then
   flowing hydrogen, oxygen, and one or more other diluent gases but not any nitrogen nor any nitrogen compound into the chamber containing the first region to grow the silicon oxide on the first region by in-situ steam generation (ISSG), the one or more diluent gases diluting one or more gaseous nitrogen compounds formed in the ISSG from nitrogen extracted from the first region.

16. The method of claim 15 wherein the one or more diluent gases have a flow rate of at least 2.5% of a flow rate of the hydrogen.

17. The method of claim 16 wherein the one or more diluent gases consist of argon.

18. The method of claim 17 wherein the one or more diluent gases' flow rate is at most 200% of the hydrogen flow rate.

19. The method of claim 17 wherein the argon flow rate is at least 10% of the hydrogen flow rate.

20. The method of claim 17 wherein the argon flow rate is at least 50% of the hydrogen flow rate.

21. The method of claim 16 wherein the one or more diluent gases' flow rate is at least 100% of the hydrogen flow rate.

22. The method of claim 16 wherein the one or more diluent gases' flow rate is at least 150% of the hydrogen flow rate.

23. The method of claim 17 wherein the argon flow rate is 200% of the hydrogen flow rate.

24. The method of claim 15 wherein the peak nitrogen concentration in the first region is reduced by at least a factor of 2 during the ISSG.

* * * * *